United States Patent [19]

Donley et al.

[11] 4,268,713
[45] May 19, 1981

[54] FLASHER FOR VEHICLE LIGHTS

[76] Inventors: Robert P. Donley, 2500 Lane Rd., Columbus, Ohio 43221; Terry Dawson, 1367 Crestview St., Reynoldsburg, Ohio 43068

[21] Appl. No.: 946,112

[22] Filed: Sep. 27, 1978

[51] Int. Cl.³ .............................................. H05K 5/00
[52] U.S. Cl. .................................. 174/52 PE; 174/51; 264/272; 340/81 R
[58] Field of Search .................. 174/52 PE, 52 S, 51; 339/14 R, 17 R, 17 B, 17 E; 337/112, 121; 335/202; 29/627; 264/272; 315/200 A; 361/399

[56] References Cited

U.S. PATENT DOCUMENTS

| | | | |
|---|---|---|---|
| 2,889,423 | 6/1959 | Yochum | 335/202 X |
| 3,581,266 | 5/1971 | Weyenberg | 174/52 PE X |
| 4,011,398 | 3/1977 | Munz et al. | 174/52 PE |
| 4,092,487 | 5/1978 | Imai | 174/52 PE |

*Primary Examiner*—B. A. Reynolds
*Assistant Examiner*—D. A. Tone

[57] ABSTRACT

A flasher for vehicle lights that comprises a housing for a circuit board that electrically controls the device. The apparatus includes a mounting strap of conductive material which includes an internal ground connection with the circuit board and on a mounting flange external of the housing that functions as the external ground connection for the circuit board. The housing is filled with a resinous material that functions as a weatherproof seal, as well as means for securing the mounting strap to the housing. The apparatus is further characterized by a secondary housing for an electrical component that communicates with the main housing and which is secured thereto and sealed by the resinous material.

8 Claims, 5 Drawing Figures

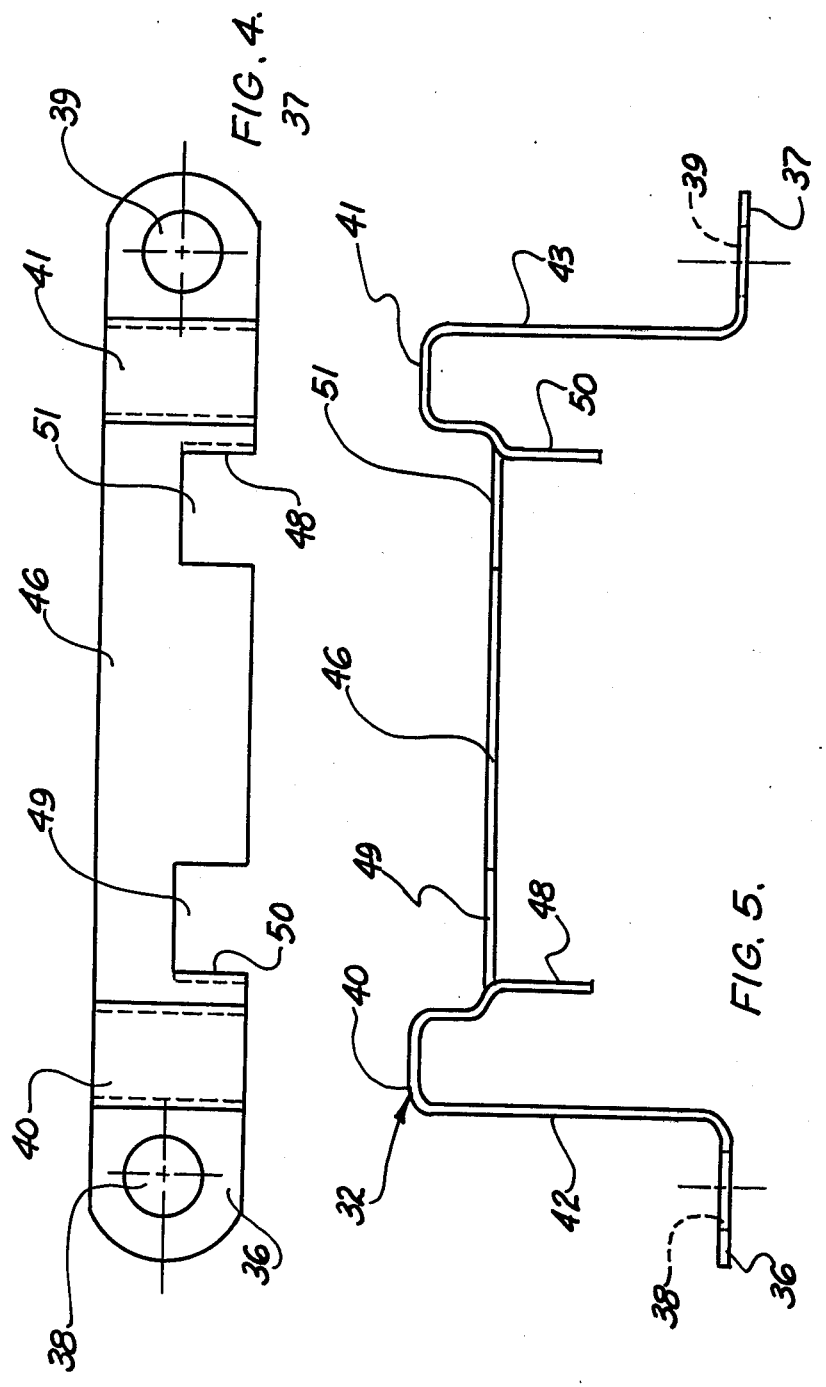

4,268,713

FLASHER FOR VEHICLE LIGHTS

BACKGROUND OF THE INVENTION

This application relates generally to flashers for vehicle lights and more particularly to an improved method and apparatus for assembly and sealing the components of such an apparatus.

PROBLEMS IN THE ART

In the use of high intensity flashers, such as are used on school buses, farm machinery and the like, a problem has been present, in that water damage is the common cause of failure of the electrical components. These devices are commonly subjected to moisture from the environment. In the case of school buses, the flashers are commonly mounted under the dashboards, and the interior of the buses are frequently washed with a hose, whereby the flashers become subjected to water damage.

SUMMARY OF THE INVENTION

In general, the present invention comprises a novel flasher apparatus, and method of making same, wherein a main housing is used to form a cavity for enclosing the circuit board. A mounting strap for securing the device to the vehicle frame is formed of electrically conductive metal and provided with an internal ground connection that plugs into a ground connection on the circuit board; as well as an external mounting flange that serves the additional function as the external ground connection for the control circuit. A potting material, such as an epoxy resin, is poured into the cavity in surrounding relationship with the circuit board and internal portion of the ground strap, so as to provide a positive weatherproof seal for the electrical components, as well as means for securing the mounting strap to the housing.

As another aspect of the present invention, a secondary housing is provided for mounting an electrical component, such as a relay connected to the circuit board, and such secondary housing is sealed and secured to the above mentioned resinous material.

As still another aspect of the present invention to provide a flasher apparatus of the type described wherein the control circuit board is provided with upstanding connectors which extend to the exterior of the main housing to form plug connectors, and which are embedded in the resinous material, so as to be sealed and reenforced thereby.

It is therefore a primary object of the present invention to provide a novel flasher apparatus, and method of fabricating same, wherein the components are assembled in a unique manner, so as to provide positive moisture protection for the electrical components.

It is another object of the present invention to provide an apparatus of the type described wherein the components are secured together with high structural integrity.

Further objects and advantages of the present invention will be apparent from the following description, reference being had to the accompanying drawings wherein preferred forms of the embodiments of the invention are clearly shown.

BRIEF DESCRIPTION OF THE DRAWINGS

FIG. 4 is a top elevational view of a mounting strap comprising a portion of the apparatus of the preceeding figures and;

FIG. 5 is a side elevational view corresponding to FIG. 4.

Figure 3:
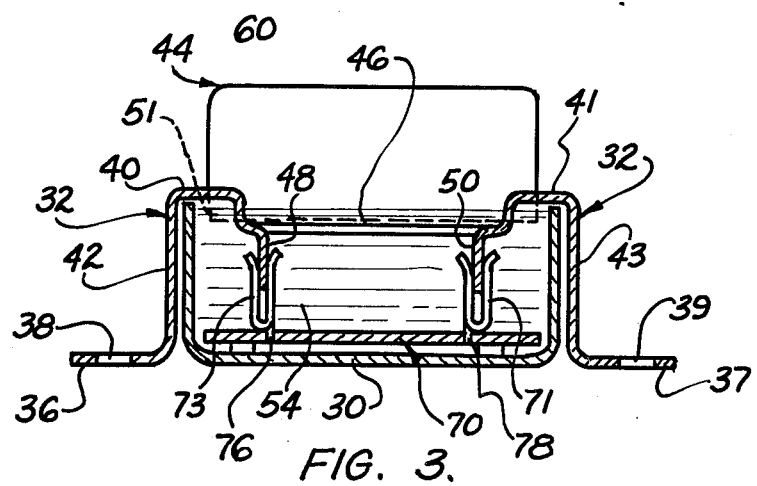
FIG. 3 is an end sectional view of the apparatus of the proceeding figures, with the section being taken along a vertical plane through the center of the apparatus.

Referring in detail to the drawings, the flasher of the present invention comprises a main housing indicated generally at 20 which forms a cavity for receiving a circuit board indicated at 70 in FIG. 3.

Figure 1:
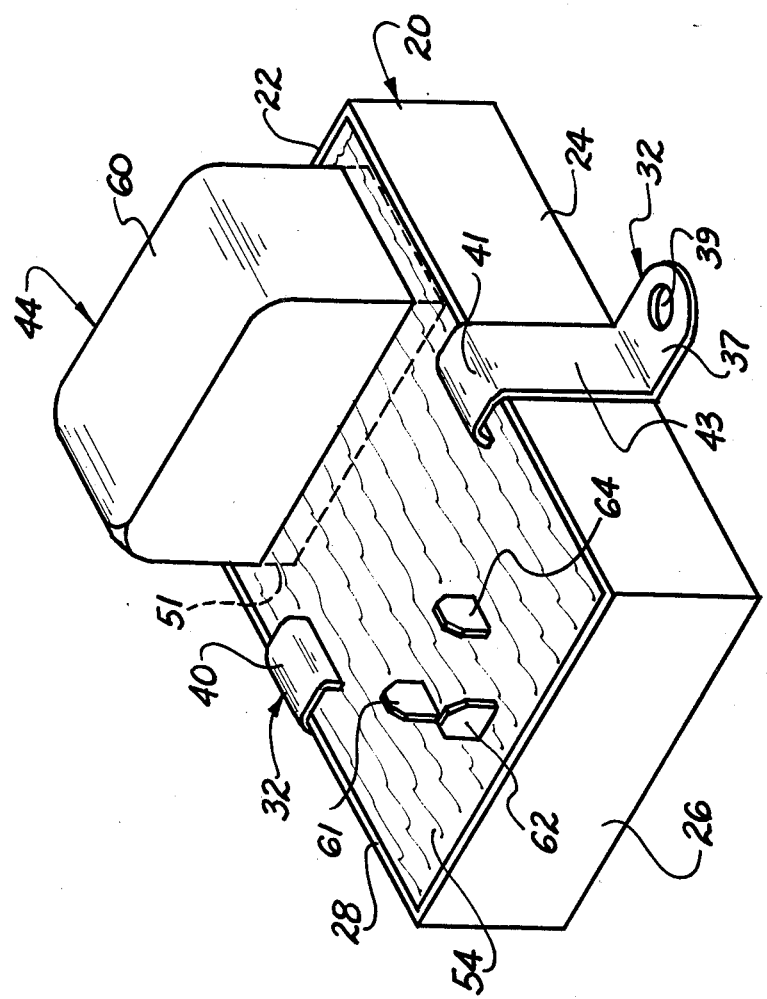
FIG. 1 is a perspective view of a flasher apparatus constructed in accordance with the present invention.
Figure 2:
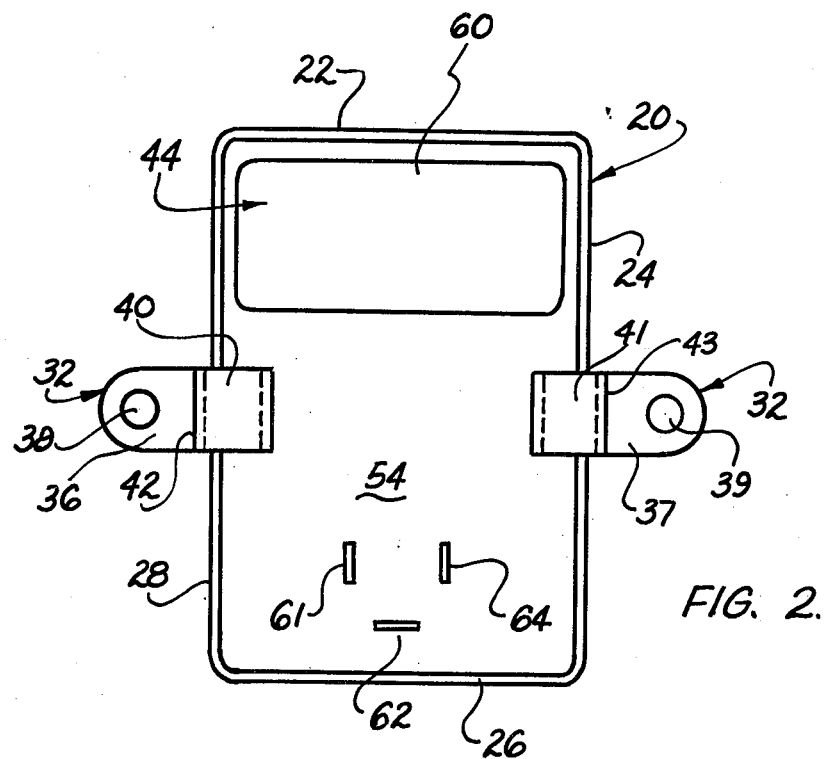
FIG. 2 is a top elevational view of the flasher apparatus of FIG. 1.

The housing 20 is secured to the vehicle frame by a mounting and grounding means or strap indicated generally at 32 and shown in assembled relationship with housing 20 in FIGS. 1-3. Strap 32 includes flanges or shoulders 48 and 50 which form inner strap ground terminals, with such flanges being bent from a central strap portion 46. One end of strap 32 includes external flanges 41, 43 and 37, with flange 37 including a mounting hole 39 for receiving a mounting screw not illustrated. The other end of mounting strap 32 includes external flange portions 40, 42 and 36 with flange 36 including a second mounting hole 38. It will now be understood that the exterior mounting flanges 36 and 37 form the external ground connections for circuit board 70, since mounting strap 32 is made from electrically conductive sheet metal material and since the internal flanges 48 and 50 are plugged into circuit board ground terminal 71 and 73 which extend upwardly from circuit board 70, as seen in FIG. 3.

After the ground strap 32 is positioned on the housing 20, as seen in FIGS. 1-3 the cavity of the housing is poured full of a suitable insulating compound 54 such as epoxy resin, such that the compound surrounds the circuit board and internal portions of mounting strap 32, including the internal ground connections 50 and 71, and 48 and 73, thereby securing the ground strap securly to housing 20.

With continued reference to FIGS. 1-3, a secondary protective housing 44 is shaped from thin sheet metal 60 or other suitable material, so as to provide a cavity for mounting an electrical component, such as a switching relay, not illustrated, which relay is electrically connected to circuit board 70 via confronting openings in the two housings 20 and 44.

As seen in FIGS. 1 and 3, secondary housing 44 includes side wall lower edges 51, which are extended into housing 20, so as to be positioned below the top of the poured resinous material, whereby the resinous material mounts secondary housing 44 on main housing 20 in sealed relationship therewith.

With reference to FIGS. 1 and 2, a plurality of upstanding conductors 61, 62, 64 are electrically connected to circuit board 70 at their lower ends, with each of the connectors including a central shank embedded in the resinous material and exposed upper ends that form a male plug that removably connects with a female plug, not illustrated, whereby external wires can be connected to circuit board 70.

While the form of embodiment of the present invention as herein disclosed constitutes a preferred form, it is to be understood that other forms might be adopted.

What is claimed is:

1. A controller for vehicle lights comprising, in combination a circuit board housing including spaced side walls and a bottom wall forming a cavity; a circuit board positioned in the cavity and including a circuit board ground terminal; an electrically conductive mounting and grounding means including an internal flange forming a second ground terminal engaging said circuit board ground terminal, an intermediate flange extending to the exterior of said cavity, and an external flange extending beyond a side wall and forming a housing supporting mount for connection with a vehicle in grounded relationship therewith; and a resinous insulating and sealing material within said cavity in sealed surrounding relationship with said engaging ground terminals.

2. The controller of claim 1 wherein the circuit board includes upstanding conductors embedded in and reenforced by the resinous material with upper ends of the conductors forming external plug connectors for the circuit board.

3. A controller for vehicle lights comprising, in combination a circuit board housing including spaced side walls and a bottom wall forming a cavity; a circuit board positioned in the cavity and including a circuit board ground terminal; mounting and grounding means comprising a sheet metal strap portion extended across said housing, a central downwardly extending flange engaging said circuit board ground terminal, and end strap portions extending beyond the housing for connection with a vehicle in grounded relationship therewith; a second housing including side walls and a top wall forming a second cavity, said side walls of the second housing including lower edges positioned within the first mentioned cavity; an electrical component positioned in the second cavity and electrically connected to the circuit board; and a resinous material within the circuit board housing in sealed surrounding relationship with the circuit board and with said lower edges of the side walls of the second housing.

4. A controller for vehicle lights comprising, in combination a circuit board housing including spaced side walls and a bottom wall forming a cavity; a circuit board positioned in the cavity and including a circuit board ground terminal; an electrically conductive mounting and grounding means including an internal flange forming a second ground terminal, an intermediate flange extending to the exterior of said cavity, and an external flange extending beyond a side wall and forming a housing supporting mount for connection with a vehicle in grounded relationship therewith; a second housing including side walls and a top wall forming a second cavity, said side walls of the second housing including lower edges positioned within the first mentioned cavity; an electrical component positioned in the second cavity and electrically connected to the circuit board; and a resinous material within the circuit board housing in sealed surrounding relationship with the circuit board board and with said lower edges of the side walls of the second housing.

5. The steps in the method of fabricating an electrical controller for a light flasher system, said method comprising positioning a circuit board within the cavity of a cup shaped circuit board housing, with the board including a circuit board ground terminal; positioning a conductive mounting strap adjacent to the circuit board housing with an internal flange portion of the strap in contact with said circuit board ground terminal, an intermediate flange portion of the strap extending to the exterior of the cavity, and an external flange portion of the strap extending beyond a side wall of the housing and forming a shoulder for mounting and grounding the controller; and filling the cavity with a dielectric potting compound so as to surround the circuit board and secure the mounting strap to the circuit board housing.

6. The method defined in claim 5 wherein the circuit board includes upstanding conductors extending to the exterior of the circuit board housing to form plug connectors, and wherein the potting compound surrounds the conductors in reenforcing relationship therewith.

7. The steps in the method of fabricating an electrical controller for a light flasher system, said method comprising positioning a circuit board within the cavity of a cup-shaped circuit board housing; positioning a conductive metal mounting means in overlying relationship with said housing with a central flange portion within the cavity, a downwardly extended flange portion electrically connected to the circuit board, and an end flange portion extending externally of the housing for mounting the controller and to provide an external electrical connection for the circuit board positioning a second housing partially within said cavity of the circuit board housing with the second housing forming a second cavity communicating with the first cavity; positioning a component of the system in said second cavity with said component in circuit with the circuit board; and filling the cavity of the circuit board housing with a potting compound so as to surround the circuit board, seal the second cavity, and mount the second housing and metal mounting means on the circuit board housing.

8. The steps in the method of fabricating an electrical controller for a light flasher system, said method comprising positioning a circuit board within the cavity of a cup-shaped circuit board housing, with the board including a circuit board ground terminal; positioning a conductive mounting strap adjacent to the circuit board housing with an internal flange portion of the strap in contact with said circuit board ground terminal, an intermediate flange portion of the strap extending to the exterior of the cavity, and an external flange portion of the strap extending beyond a side wall of the housing and forming a shoulder for mounting and grounding the controller; positioning a second housing partially within said cavity of the circuit board housing with the second housing forming a second cavity communicating with the first cavity; positioning a component of the system in said second cavity with said component in circuit with the circuit board; and filling the cavity of the circuit board housing with a potting compound so as to seal the cavities and secure the mounting strap and second housing to the circuit board housing.

* * * * *